(12) United States Patent
Pan et al.

(10) Patent No.: US 6,900,143 B1
(45) Date of Patent: May 31, 2005

(54) STRAINED SILICON MOSFETS HAVING IMPROVED THERMAL DISSIPATION

(75) Inventors: James N. Pan, Santa Clara, CA (US); Jung-Suk Goo, Stanford, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/658,963

(22) Filed: Sep. 9, 2003

(51) Int. Cl.[7] .............................................. H01L 21/461
(52) U.S. Cl. ....................... 438/752; 257/347; 257/348; 257/349
(58) Field of Search ................................ 438/149, 479, 438/571, 572; 257/347–353

(56) References Cited

U.S. PATENT DOCUMENTS

| | | | | | |
|---|---|---|---|---|---|
| 4,495,262 A | * | 1/1985 | Matsuzaki et al. | ......... | 430/57.5 |
| 4,882,252 A | * | 11/1989 | Kawamura et al. | ........ | 430/57.6 |
| 5,434,094 A | * | 7/1995 | Kobiki et al. | ................ | 438/167 |
| 6,639,249 B2 | * | 10/2003 | Valliath | ........................ | 257/88 |

* cited by examiner

*Primary Examiner*—Hoai Pham
*Assistant Examiner*—Nathan W. Ha
(74) *Attorney, Agent, or Firm*—Foley & Lardner LLP

(57) ABSTRACT

The thermal conductivity of strained silicon MOSFETs and strained silicon SOI MOSFETs is improved by providing a silicon germanium carbide thermal dissipation layer beneath a silicon germanium layer on which strained silicon is grown. The silicon germanium carbide thermal dissipation layer has a higher thermal conductivity than silicon germanium, thus providing more efficient removal of thermal energy generated in active regions.

15 Claims, 10 Drawing Sheets

Figure 8d
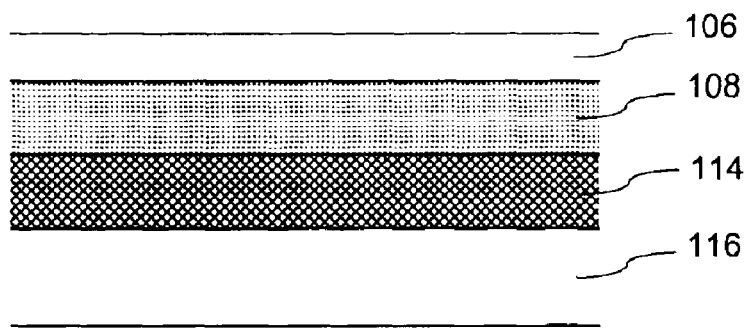
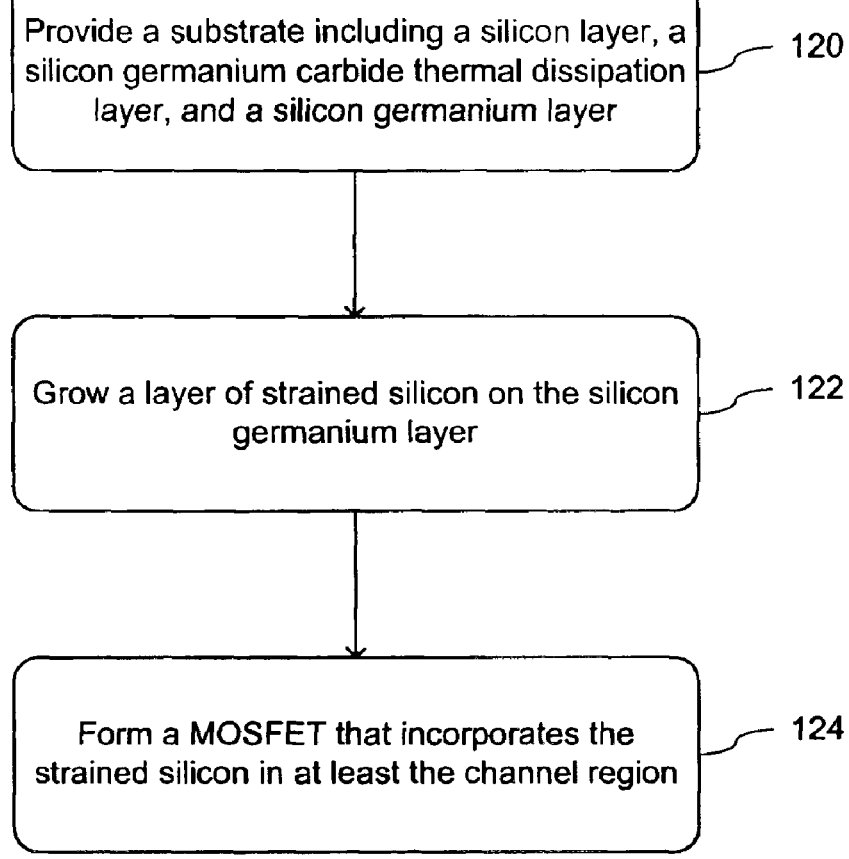
Figure 9

US 6,900,143 B1

STRAINED SILICON MOSFETS HAVING IMPROVED THERMAL DISSIPATION

BACKGROUND OF THE INVENTION

1. Field of the Invention

The present invention relates generally to fabrication of metal oxide semiconductor field effect transistors (MOSFETs), and, more particularly, to MOSFETs that achieve improved carrier mobility through the incorporation of strained silicon.

2. Related Technology

MOSFETs are a common component of integrated circuits (ICs). FIG. 1 shows a cross sectional view of a conventional MOSFET device. The MOSFET is fabricated on a silicon substrate 10 within an active region bounded by shallow trench isolations 12 that electrically isolate the active region of the MOSFET from other IC components fabricated on the substrate 10.

The MOSFET is comprised of a gate 14 and a channel region 16 that are separated by a thin gate insulator 18 such as silicon oxide or silicon oxynitride. A voltage applied to the gate 14 capacitively controls the creation of an inversion layer in the channel region 16 that provides carriers for conduction between the source and drain. To minimize the resistance of the gate 14, the gate 14 is typically formed of a doped semiconductor material such as polysilicon.

The source and drain of the MOSFET comprise deep source and drain regions 20 formed on opposing sides of the channel region 16. The deep source and drain regions 20 are formed by ion implantation subsequent to the formation of a spacer 22 around the gate 14. The spacer 22 serves as a mask during implantation to define the lateral positions of the deep source and drain regions 20 relative to the channel region 16.

Source and drain silicides 24 are formed on the deep source and drain regions 20 to provide ohmic contacts and reduce contact resistance. The silicides 24 are comprised of the substrate semiconductor material and a metal such as cobalt (Co) or nickel (Ni). The deep source and drain regions 20 are formed deeply enough to extend beyond the depth to which the source and drain suicides 24 are formed. The gate 14 likewise has a silicide 26 formed on its upper surface. A gate structure comprising a polysilicon material and an overlying silicide is sometimes referred to as a polycide gate.

The source and drain of the MOSFET further comprise shallow source and drain extensions 28. As dimensions of the MOSFET are reduced, short channel effects resulting from the small distance between the source and drain cause degradation of MOSFET performance. The use of shallow source and drain extensions 28 rather than deep source and drain regions near the ends of the channel 16 helps to reduce short channel effects. The shallow source and drain extensions 28 are implanted after the formation of a protective layer 30 around the gate 14 and over the substrate, and prior to the formation of the spacer 22. The gate 14 and the protective layer 30 act as an implantation mask to define the lateral position of the shallow source and drain extensions 28 relative to the channel region 16. Diffusion during subsequent annealing causes the shallow source and drain extensions 28 to extend slightly beneath the gate 14.

One option for increasing the performance of MOSFETs is to enhance the carrier mobility of the MOSFET semiconductor material so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is more widely spaced on average than a pure silicon lattice because of the presence of the larger germanium atoms in the lattice. Since the atoms of the silicon lattice align with the more widely spaced silicon germanium lattice, a tensile strain is created in the silicon layer. The silicon atoms are essentially pulled apart from one another. The amount of tensile strain applied to the silicon lattice increases with the proportion of germanium in the silicon germanium lattice.

The tensile strain applied to the silicon lattice increases carrier mobility. Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET incorporating a strained silicon layer is shown in FIG. 2. The MOSFET is fabricated on a substrate comprising a silicon germanium layer 32 grown on a silicon layer 10. An epitaxial layer of strained silicon 34 is grown on the silicon germanium layer 32. The MOSFET uses conventional MOSFET structures including deep source and drain regions 20, shallow source and drain extensions 28, a gate oxide layer 18, a gate 14 surrounded by a protective layer 30, a spacer 22, source and drain silicides 24, a gate silicide 26, and shallow trench isolations 12. The channel region of the MOSFET includes the strained silicon material, which provides enhanced carrier mobility between the source and drain.

An alternative to the formation of devices in semiconductor substrates is silicon on insulator (SOI) construction. In SOI construction, MOSFETs are formed on a substrate that includes a layer of a dielectric material beneath the MOSFET active regions. SOI devices have a number of advantages over devices formed in a shared semiconductor substrate, such as better isolation between devices, reduced leakage current, reduced latch-up between CMOS elements, reduced chip capacitance, and reduction or elimination of short channel coupling between source and drain regions.

FIG. 3 shows an example of a strained silicon MOSFET formed on an SOI substrate. In this example, the MOSFET is formed on an SOI substrate that comprises a silicon germanium layer 32 provided on a dielectric layer 36. The MOSFET is formed within an active region defined by trench isolations 12 that extend through the silicon germanium layer 32 to the underlying dielectric layer 36. In one alternative to the SOI structure of FIG. 3, strained silicon FinFETs comprised of monolithic silicon germanium Fin- FET bodies having strained silicon grown thereon may be formed from the silicon germanium SOI substrate. An alternative type of SOI MOSFET, known as a FinFET, is formed by patterning monolithic semiconductor bodies comprising source, drain and channel regions from a semiconductor layer formed on a dielectric substrate.

The substrate for a conventional SOI device may be formed in a variety of manners. FIGS. 4a–4b show structures formed using a buried oxide (BOX) method for forming an SOI substrate. As shown in FIG. 4a, a silicon substrate 40 is provided. The silicon substrate 40 is implanted with oxygen 42 at an energy sufficient to form an oxygenated region 44 at such a depth as to leave a required thickness of silicon above the oxygenated region. FIG. 4b shows the structure of FIG. 4a after annealing of the silicon substrate 40 to form a buried silicon oxide layer 46 within the substrate. Annealing is typically performed at approximately 1350 degrees C. for approximately four hours. The oxide layer 30 serves as the dielectric layer of the SOI substrate.

FIGS. 5a–5d show structures formed in accordance with a wafer bonding method for forming an SOI substrate. FIG. 5a shows a planarized silicon substrate 48. The substrate 48 is implanted with hydrogen 50 to form a hydrogen rich region 52 within the silicon material. The hydrogen 50 is implanted with an energy such that the amount of silicon remaining above the hydrogen rich region exceeds the thickness of the silicon layer to be formed on the SOI substrate. In some applications a different material such as oxygen may be implanted.

FIG. 5b shows the silicon substrate 48 of FIG. 5a after being cleaned, stripped of oxide in a diluted HF solution, rinsed in deionized water to form an active native oxide on its surface, and then inverted and bonded to a planarized oxide layer 56 formed on a semiconductor layer 58 of second substrate 54. To facilitate bonding, adjoining surfaces of the substrates are planarized to a homogeneity of 0.5 microns or less. Bonding is generally performed in two stages. In a first stage, the substrates are heated to approximately 600 degrees C. in an inert environment for approximately three hours. As shown in FIG. 5c, the heating of the first stage causes bonding of the silicon substrate 48 to the dielectric layer 56 of the second substrate 54 due to Van der Waals forces. The heating of the first stage also causes the first substrate 48 to fracture in the hydrogen rich region 52. After the first heating stage the fractured portion of the first substrate is removed, leaving a new substrate comprising a silicon layer 59 bonded to an oxide layer 56, and having a residual hydrogen rich region 52 at its upper surface.

In a second stage of the bonding process, the bonded structure is heated to approximately 1050–1200 degrees C. for 30 minutes to two hours to strengthen the bond between the dielectric layer 56 and the silicon layer 59. The resulting substrate is then planarized and cleaned, leaving a silicon SOI substrate as shown in FIG. 5d. Where it is desired to form strained silicon SOI devices, a silicon germanium SOI substrate may be formed instead of a silicon SOI substrate, and strained silicon may then be grown on the silicon germanium.

One detrimental property of strained silicon devices and SOI devices is that they have poor thermal conductivity compared to conventional devices formed in silicon substrates. Heat generated in the active region of a MOSFET formed in a silicon substrate is conducted away from the active region through the silicon substrate, which has a relatively good thermal conductivity of 1.5 W/cm-C°. In contrast, the thermal conductivity of a typical silicon germanium layer used in a strained silicon device is approximately 0.1 W/cm-C° for a silicon germanium layer having a 20% germanium content, which results in significantly less efficient dissipation of heat to the underlying silicon layer. Further, the oxide layer of an SOI substrate has a very poor thermal conductivity of less than 0.02 W/cm-C°. As a result, insufficient dissipation of thermal energy can occur in strained silicon devices and particularly in strained silicon SOI devices, leading to significant self-heating. Self-heating is known to degrade the I-V characteristics of the MOSFET, such that a reduced source-drain current Ids is produced for a given source-drain voltage Vds.

Therefore the advantages of strained silicon MOSFETs and MOSFETs formed by SOI construction are partly offset by the disadvantages resulting from the poor thermal conductivity of silicon germanium and oxide layers.

SUMMARY OF THE INVENTION

In accordance with the invention, the thermal conductivity of strained silicon MOSFETs and strained silicon SOI MOSFETs is improved by providing a silicon germanium carbide thermal dissipation layer beneath a silicon germanium layer on which strained silicon is grown. The thermal conductivity of the silicon germanium carbide thermal dissipation layer depends on the proportion of carbon and may be in the range of 1–100 W/cm-C°. Thus the thermal conductivity of the silicon germanium carbide thermal dissipation layer is at least comparable to the thermal conductivity of silicon and may be significantly greater than the thermal conductivity of silicon where a large proportion of carbon is employed. Consequently the use of a silicon germanium carbide thermal dissipation layer improves the efficiency of the removal of thermal energy from the active regions of strained silicon devices.

In accordance with one embodiment of the invention, a MOSFET is formed on a substrate that comprises a layer of silicon germanium formed over a silicon germanium carbide thermal dissipation layer. The MOSFET typically is formed in an active region defined by shallow trench isolations, and includes strained silicon in at least the channel region. The substrate may be a semiconductor substrate in which the silicon germanium carbide thermal dissipation layer is formed on a silicon wafer, or the substrate may be an SOI substrate in which the silicon germanium carbide thermal dissipation layer is formed on a dielectric layer. The silicon germanium carbide thermal dissipation layer provides enhanced thermal dissipation in both semiconductor substrate and SOI devices.

In accordance with further embodiments of the invention, a semiconductor device is fabricated by providing a substrate that comprises a silicon layer, a silicon germanium carbide thermal dissipation layer, and a silicon germanium layer. A layer of strained silicon is grown on the silicon germanium layer, and a MOSFET that incorporates the strained silicon in at least its channel region is then formed. Devices formed in this manner exhibit improved thermal dissipation compared to strained silicon MOSFETs formed on conventional silicon germanium substrates.

In accordance with further embodiments of the invention, a semiconductor device is fabricated by providing a substrate that comprises a dielectric layer, a silicon germanium carbide thermal dissipation layer, and a silicon germanium layer. A layer of strained silicon is grown on the silicon germanium layer, and then a MOSFET that incorporates the strained silicon in at least its channel region is formed on the substrate. The dielectric layer of the substrate may be formed by a buried oxide method or a wafer bonding method. Devices formed in this manner exhibit improved thermal dissipation compared to strained silicon SOI MOSFETs formed on silicon germanium SOI substrates.

DESCRIPTION OF THE DRAWINGS

Embodiments of the invention are described in conjunction with the following drawings, in which:

FIGS. 8a, 8b, 8c and 8d show structures formed during production of a SOI substrate by a wafer bonding method in accordance with the second preferred embodiment;

FIG. 9 shows a process flow encompassing the first preferred embodiment and alternative embodiments.

DETAILED DESCRIPTION OF PREFERRED EMBODIMENTS

Figure 6A:
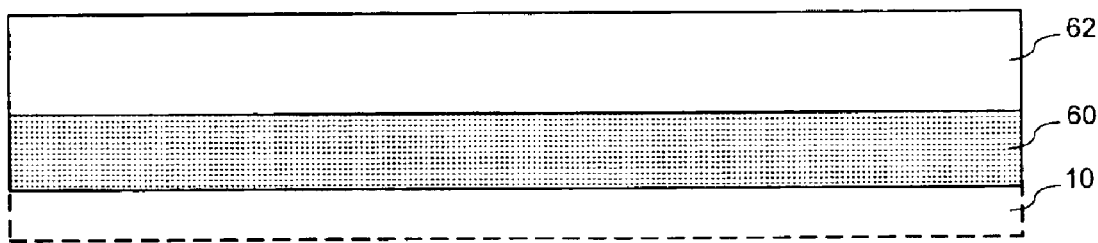
FIGS. 6a, 6b, 6c, 6d, 6e, 6f, 6g, 6h, 6i and 6j show structures formed during production of a MOSFET device in accordance with a first preferred embodiment of the invention.

FIGS. 6a–6j show structures formed during fabrication of a strained silicon SOI MOSFET in accordance with preferred embodiments of the invention. FIG. 6a shows a structure comprising a silicon substrate 10 having grown thereon a silicon germanium carbide thermal dissipation layer 60, and having a silicon germanium layer 62 grown on the thermal dissipation layer 60.

The silicon germanium carbide thermal dissipation layer 60 preferably has a lattice constant that is matched to the lattice constant of the overlying silicon germanium layer. In general the composition of the silicon germanium carbide layer is 60–90% silicon, 10–40% germanium, and 10–30% carbon, with increased proportions of silicon and carbon providing increased thermal conductivity. Silicon germanium carbide may be grown, for example, by chemical vapor deposition using source gases including a silicon source gas such as $Si_2H_6$ (disilane) or $SiH_4$ (silane), a germanium source gas such as $GeH_4$ (germane), and a carbon source gas such as methane ($CH_4$). In the alternative, an organosilane source gas may provide both silicon and carbon precursors. Such gases include methylsilane ($SiCH_6$), dimethylsilane ($SiC_2H_8$), trimethylsilane ($SiC_3H_{10}$), tetramethylsilane ($SiC_4H_{12}$), and diethylsilane ($SiC_4H_{12}$). A typical deposition temperature is in the range of 200–700 degrees C., and pressures and flow rates for the gases are selected in accordance with the particular composition to be produced. The entire thickness of the silicon germanium carbide thermal dissipation layer 62 may be grown with uniform proportions, or alternatively the partial pressure of $GeH_4$ may be gradually increased beginning from a lower pressure or zero pressure to form a gradient composition having a high silicon carbide content and a low germanium content at the lower portion, and a higher germanium content at the upper portion. The thickness of the silicon germanium carbide thermal dissipation layer 60 may be determined in accordance with the particular application.

The silicon germanium layer 62 preferably has a composition $Si_{1-x}Ge_x$, where x is approximately 0.2, and is more generally in the range of 0.1 to 0.3. Silicon germanium may be grown, for example, by chemical vapor deposition using $Si_2H_6$ (disilane) and $GeH_4$ (germane) as source gases, with a substrate temperature of 600 to 900 degrees C., a $Si_2H_6$ partial pressure of 30 mPa, and a $GeH_4$ partial pressure of 60 mPa. $SiH_4$ (silane) may be used as a source of silicon in alternative processes. The upper portion of the silicon germanium substrate 62 should have a uniform composition. The silicon germanium carbide layer 60 and the silicon germanium layer 62 are preferably grown in a single continuous in situ deposition.

Figure 6B:
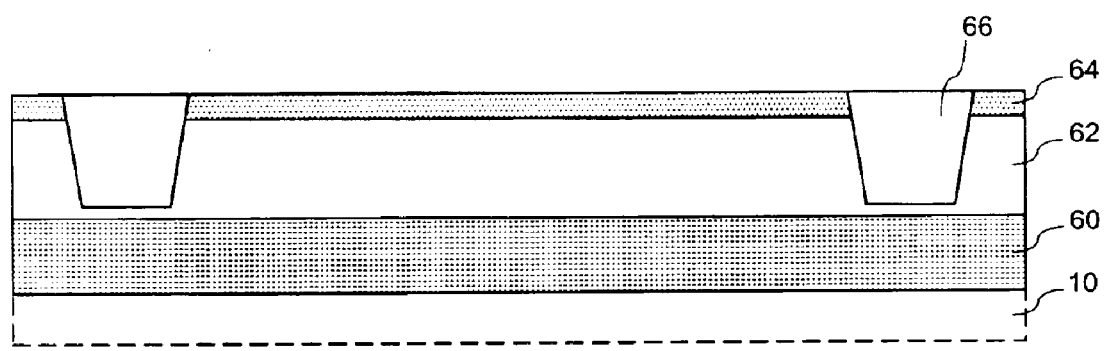

FIG. 6b shows the structure of FIG. 6a after formation of shallow trench isolations 66 having tapered sidewalls in the silicon germanium layer 62, followed by selective growth of an epitaxial layer of strained silicon layer 64 on the silicon germanium layer 62. The shallow trench isolations 44 define an active region of the substrate in which a MOSFET will be formed. The shallow trench isolations 66 may be formed by forming trenches in the silicon germanium, performing a brief thermal oxidation of the silicon germanium, and then depositing a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process. In accordance with one preferred alternative, the shallow trench isolations are comprised of an oxide trench liner and a silicon carbide bulk fill material. The silicon carbide bulk fill material has high thermal conductivity and provides further dissipation of heat generated in the active regions. Shallow trench isolations of this type preferably contact the silicon germanium carbide layer to provide a direct path for thermal dissipation.

The strained silicon layer 64 is preferably grown by chemical vapor deposition using $Si_2He$ as a source gas with a partial pressure of 30 mPa and a substrate temperature of approximately 600 to 900 degrees C. The strained silicon layer is preferably grown to a thickness of 200 Angstroms. The maximum thickness of strained silicon that can be grown without misfit dislocations will depend on the percentage of germanium in the silicon germanium layer 62. It is preferable to form the shallow trench isolations 66 prior to growth of the strained silicon layer 64 to avoid creation of misfit dislocations in the strained silicon 64 as a result of the high temperatures used during formation of the shallow trench isolations.

Figure 6C:
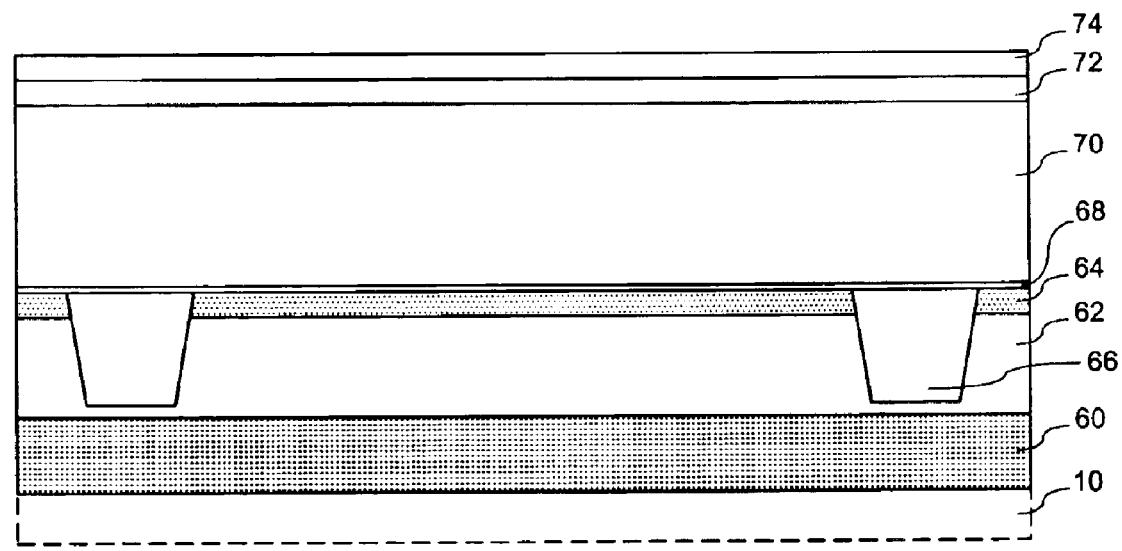

FIG. 6c shows the structure of FIG. 6b after formation of multiple layers of material over the strained silicon layer 64 and the shallow trench isolations 66. A thin gate insulating layer 68 is formed on the strained silicon layer 64. The gate insulating layer 68 is typically silicon oxide but may be another material such as silicon oxynitride. Silicon oxide may be grown by thermal oxidation of the strained silicon layer 64 or may be deposited by chemical vapor deposition. Formed over the gate insulating layer 68 is a gate conductive layer 70. The gate conductive layer 70 typically comprises polysilicon that is heavily doped with an n-type dopant such as arsenic or boron. In some instances the polysilicon may also be implanted with germanium to create strain for enhancing carrier mobility. Overlying the gate conductive layer 70 is a bi-layer hardmask structure comprising a lower hardmask layer 72, also referred to as a bottom antireflective coating (BARC), and an upper hardmask layer 74. The lower hardmask layer 72 is typically silicon oxynitride and the upper hardmask layer 74 is typically silicon nitride (e.g. Si$_3$N$_4$). The thicknesses of the layers are chosen to provide the desired antireflective properties.

Figure 6D:
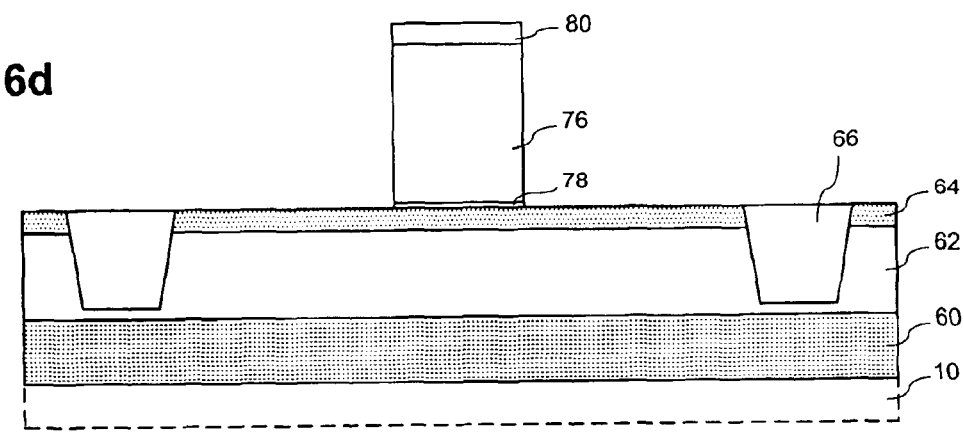

FIG. 6d shows the structure of FIG. 6c after patterning of the gate conductive layer to form a gate 76. Patterning of the gate conductive layer typically removes at least a portion of any unprotected gate insulator layer material, leaving a gate insulator 78 beneath the gate 76. Patterning is performed using a series of anisotropic etches that patterns the upper hardmask layer using a photoresist mask as an etch mask, then patterns the lower hardmask layer using the patterned upper hardmask layer as an etch mask, then patterns the polysilicon using the patterned lower hardmask layer as an etch mask. A protective cap 80 formed from the silicon oxynitride BARC layer may be left on the gate 76.

Figure 6E:
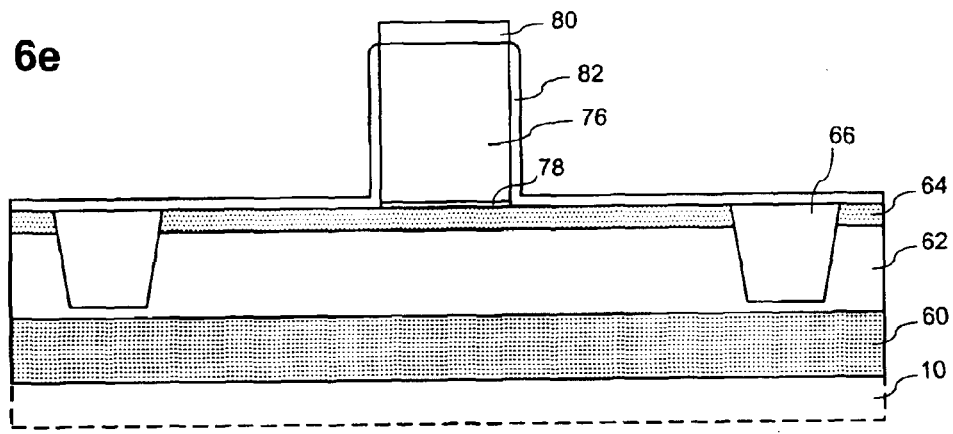

FIG. 6e shows the structure of FIG. 6d after formation of a protective silicon oxide layer 82 on the strained silicon layer 64 and the exposed sidewalls of the gate 76. The protective layer 82 may be formed by thermal oxidation of the gate 76 and strained silicon 64.

Figure 6F:
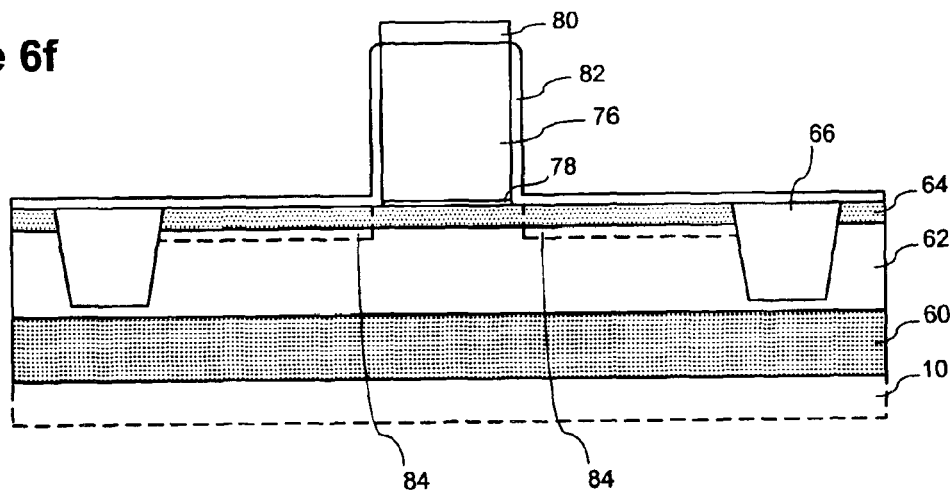

FIG. 6f shows the structure of FIG. 6e after implantation of dopant by ion implantation to form shallow source and drain extensions 84 in the strained silicon layer 64 and silicon germanium layer 62 at opposing sides of the gate 76. Halo regions (not shown) may be implanted prior to implantation of the shallow source and drain extensions 84. Halo regions are regions that are implanted with a dopant that has a conductivity type that is opposite to that of the source and drain region dopants. The dopant of the halo regions retards diffusion of the dopant of the source and drain extensions. Halo regions are preferably implanted using a low energy at an angle to the surface of the substrate so that the halo regions extend beneath the gate 76 to beyond the anticipated locations of the ends of the source and drain extensions 84 after annealing.

Figure 6G:
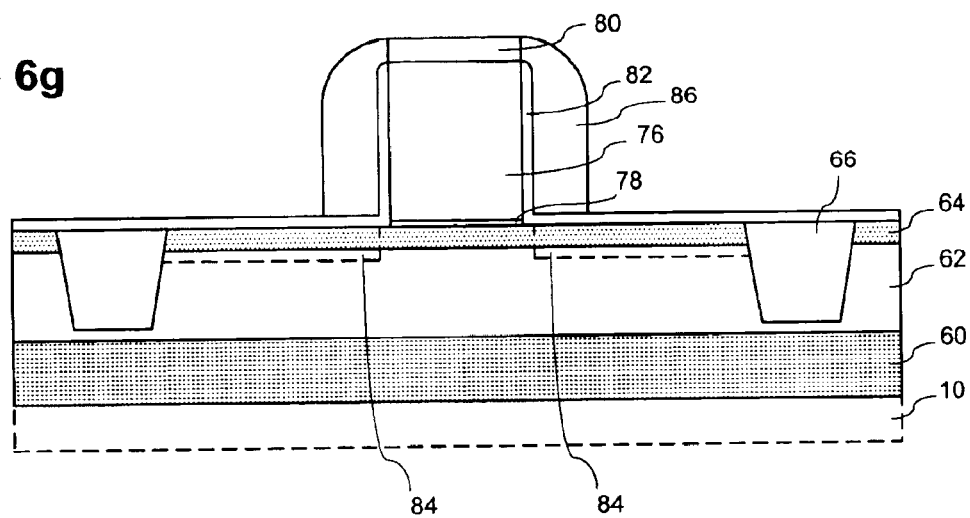

FIG. 6g shows the structure of FIG. 6f after formation of a spacer 86 around the gate 76. The spacer 86 is preferably formed of silicon oxide. The spacer 86 may be formed by depositing a conformal layer of silicon oxide, followed by an etch back process to remove the silicon oxide from the substrate, leaving silicon oxide on the sidewalls of the gate as the spacer 80.

Figure 6H:
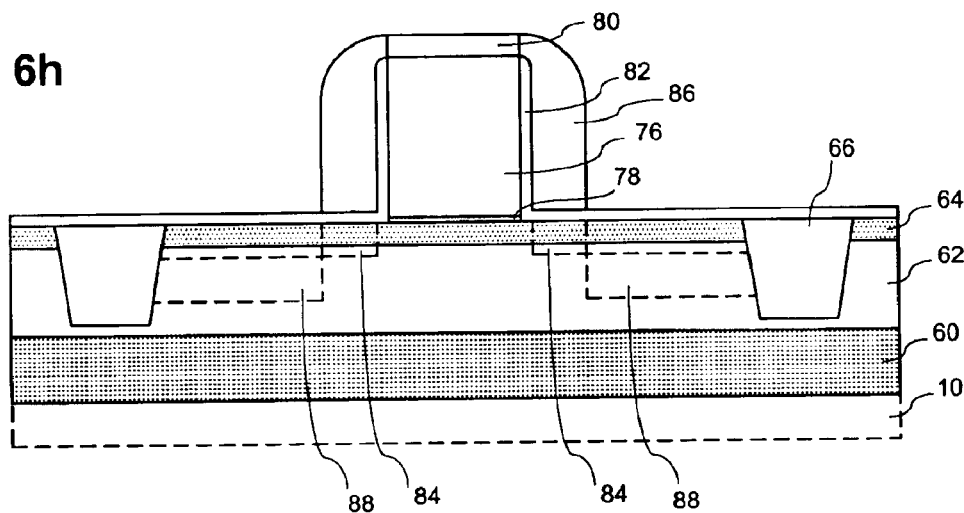

FIG. 6h shows the structure of FIG. 6g after formation of deep source and drain regions 88 in the strained silicon 64 and silicon germanium 62 layers at opposing sides of the gate 76 by implantation of dopant. The spacer 86 serves as a mask during implantation of the deep source and drain regions 88 to define the lateral positions of the source and drain regions 88 relative to the gate 76.

Figure 6I:
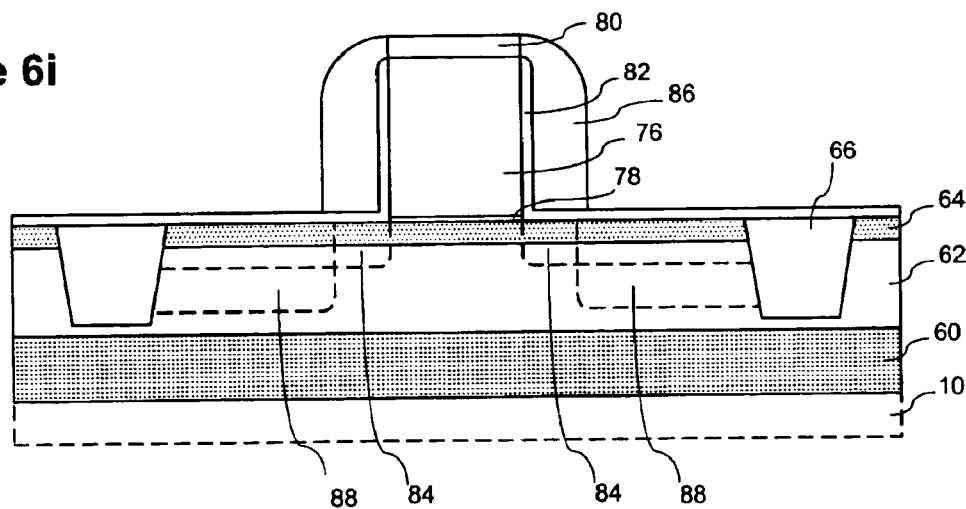

FIG. 6i shows the structure of FIG. 6h after performing rapid thermal annealing (RTA) to anneal the silicon germanium layer 62 and strained silicon layer 64 and to activate the dopants implanted in the shallow source and drain extensions 84 and the deep source and drain regions 88. During annealing the implanted dopant undergoes diffusion, causing a smoothing of the contours of the respective regions.

Figure 6J:
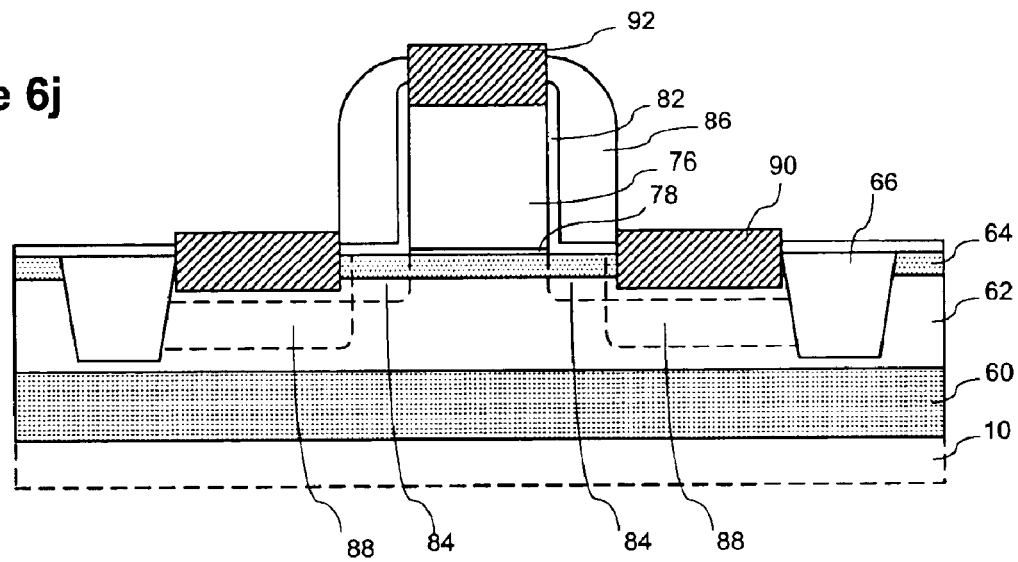

FIG. 6j shows the structure of FIG. 6i after formation of source and drain suicides 90 and a gate silicide 92. The suicides 90, 92 are formed of a compound comprising a semiconductor material and a metal. Typically a metal such as cobalt (Co) is used, however other metals such as nickel (Ni) may also be employed. The suicides are formed by depositing a thin conformal layer of the metal over the entire structure, and then annealing to promote silicide formation at the points of contact between the metal and underlying semiconductor materials, followed by stripping of residual metal. Formation of suicides is typically preceded by a patterning step to remove oxides and protective layers from portions of the gate and the source and drain regions where the suicides are to be formed.

Figure 1:
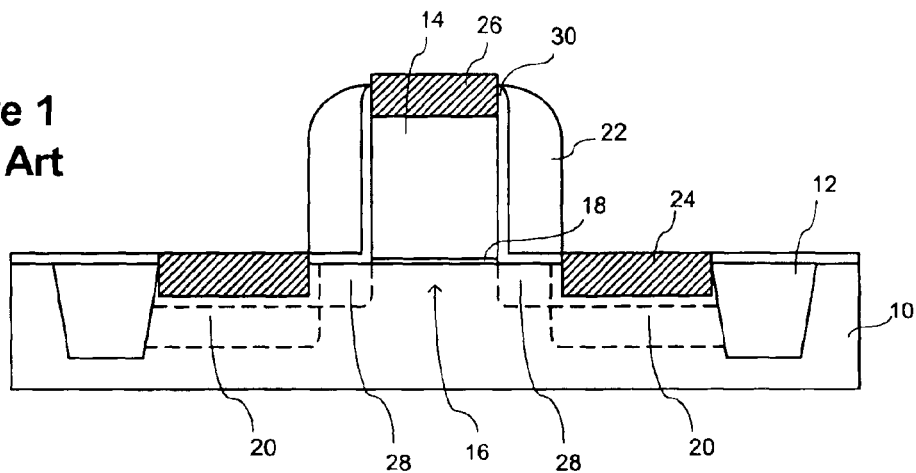
FIG. 1 shows a conventional MOSFET formed in accordance with conventional processing.
Figure 2:
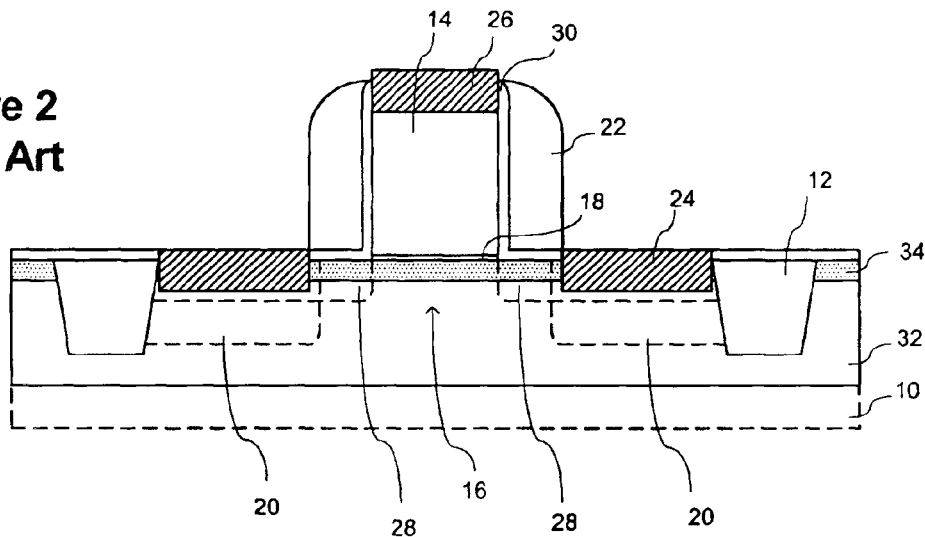
FIG. 2 shows a strained silicon MOSFET device.
Figure 3:
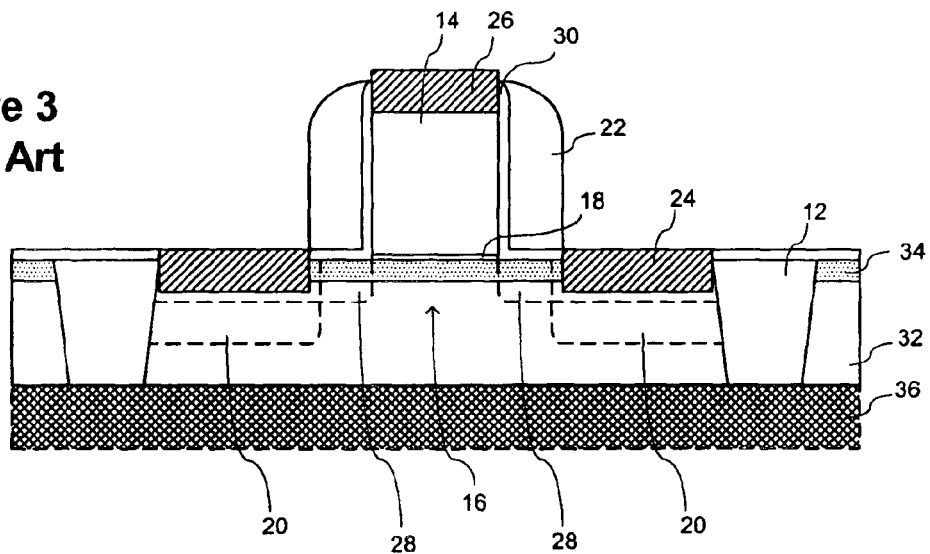
FIG. 3 shows a strained silicon MOSFET device formed on an SOI substrate.
Figure 4A:
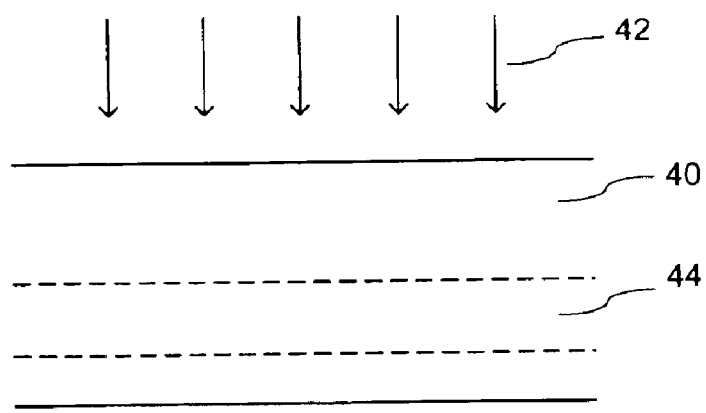
FIGS. 4a and 4b show the formation of a buried oxide (BOX) SOI substrate.
Figure 4B:
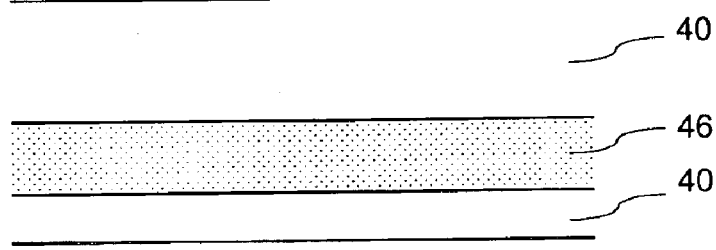

The structure of FIG. 6j is advantageous compared to the conventional structure of FIG. 2 in that the silicon germanium carbide thermal dissipation layer 60 conducts heat away from the active regions to the silicon substrate more efficiently than the silicon germanium layer of the conventional device, thus reducing self heating and improving device performance.

FIG. 9 shows a process flow for forming a semiconductor device encompassing the preferred embodiment of FIGS. 6a–6j and alternative embodiments. Initially a substrate is provided (120). The substrate comprises a silicon layer, a silicon germanium carbide thermal dissipation layer, and a silicon germanium layer. A layer of strained silicon is then grown on the silicon germanium layer (122), and a MOSFET that incorporates the strained silicon in at least its channel region is then formed (124).

While the structures illustrated in FIGS. 6a–6j represent processing performed in accordance with one preferred embodiment of the invention, a variety of alternatives may be implemented. For instance, a silicon germanium carbide thermal dissipation layer may be implemented in an SOI substrate that includes a silicon germanium layer for the formation of strained silicon. Such a substrate may be formed using either a buried oxide (BOX) method or a bonding method.

Figure 7A:
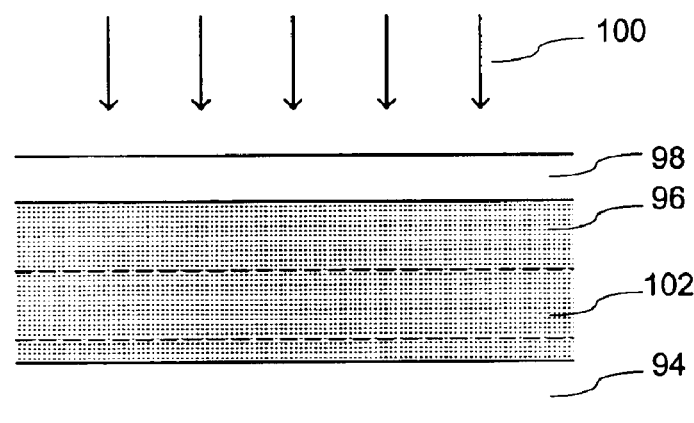
FIGS. 7a and 7b show structures formed during production of a SOI substrate by a BOX method in accordance with a second preferred embodiment.
Figure 7B:
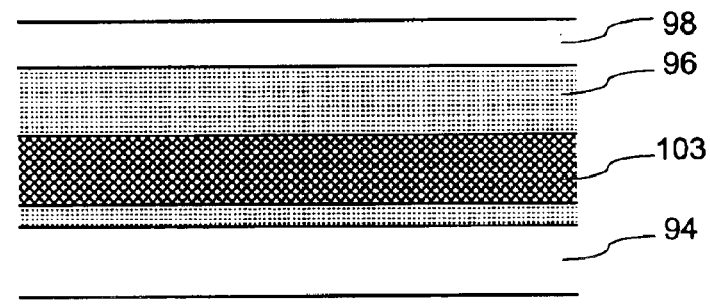

FIGS. 7a–7b show structures formed during processing to produce an SOI substrate comprising a silicon germanium carbide thermal dissipation layer using the buried oxide (BOX) method. As shown in FIG. 7, a substrate including a silicon layer 94, a silicon germanium carbide layer 96 and a silicon germanium layer 98 is provided. This structure may be fabricated as described above with respect to FIG. 6a. Oxygen 100 is implanted into the silicon germanium carbide layer 96 to form an oxygen implanted region 102. The substrate is then annealed to form an oxide layer 103 within the silicon germanium carbide layer 96 as shown in FIG. 7b. MOSFETs may then be formed on this substrate, for example using the processing illustrated in FIGS. 6a–6j. The processing of FIGS. 7a–7b is preferred in that forms the buried oxide layer prior to growth of strained silicon, thereby avoiding the creation of misfit dislocations in the strained silicon that would occur when subjected to the high temperatures used for oxide formation.

Figure 8A:
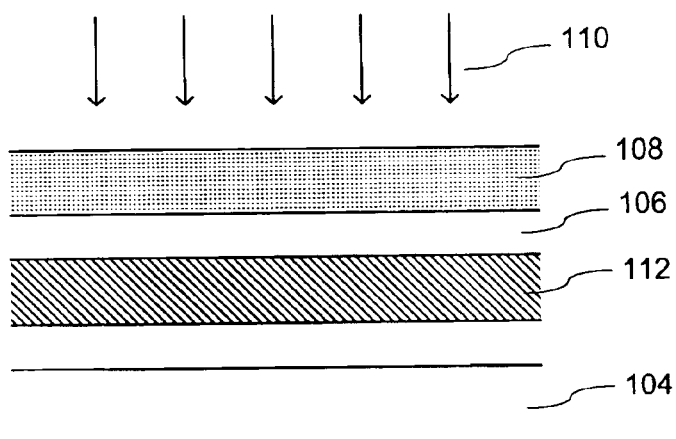

FIGS. 8a–8d shows structures formed during processing to produce an SOI substrate comprising a silicon germanium carbide thermal dissipation layer using the wafer bonding method. FIG. 8a shows a first silicon substrate 104 having formed thereon a silicon germanium layer 106 and a silicon germanium carbide layer 108. The first substrate 104 is implanted with hydrogen 110 to form a hydrogen rich region 112 within the silicon germanium layer 106. The hydrogen 110 is implanted with an energy such that the amount of silicon germanium remaining above the hydrogen rich region exceeds the thickness of the silicon germanium layer to be formed on the SOI substrate. In some applications a different material such as oxygen may be implanted.

Figure 8B:
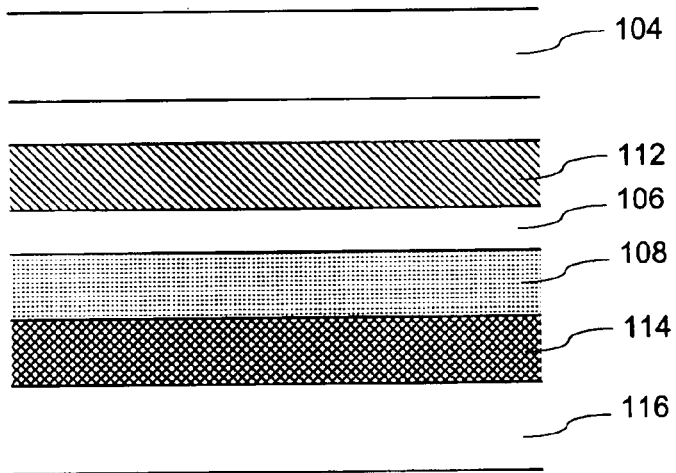
Figure 8C:
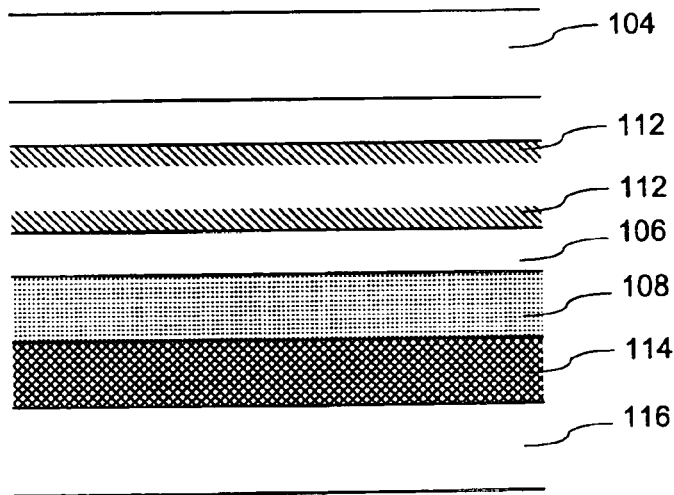

FIG. 8b shows the silicon substrate 104 of FIG. 8a after being cleaned, stripped of oxide in a diluted HF solution, rinsed in deionized water to form an active native oxide on its surface, and then inverted and bonded to a planarized dielectric layer 114 formed on a semiconductor layer of second substrate 116. The second substrate 116 is typically a silicon wafer and the dielectric layer 114 is typically a silicon oxide layer. To facilitate bonding, the substrates should be planarized to a homogeneity of 0.5 microns or less. Bonding is generally performed in two stages. In a first stage, the substrates are heated to approximately 600 degrees C. in an inert environment for approximately three hours. As shown in FIG. 8c, the heating of the first stage causes the silicon germanium carbide layer 108 of the first substrate to bond to the dielectric layer 114 of the second substrate by means of Van der Waals forces. This heating also causes the silicon germanium layer 106 of the first substrate to fracture in the hydrogen rich region 112, thus yielding a new substrate comprising a silicon germanium carbide layer 108 bonded to an oxide layer 114, and having a silicon germanium layer 106 formed thereon and a residual hydrogen rich region 112 at the upper surface of the silicon germanium layer 106. In a second stage of the bonding process, the bonded structure is heated to approximately 1050–1200 degrees C. for 30 minutes to two hours to strengthen the bond between the dielectric layer 114 and the silicon germanium carbide layer 108.

Figure 5A:
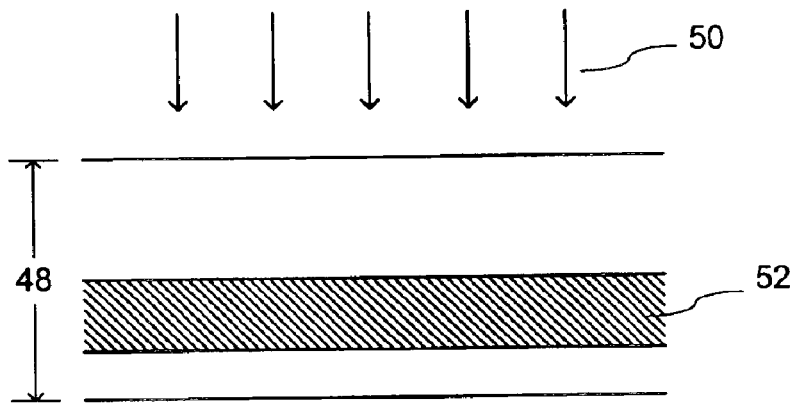
FIGS. 5a, 5b, 5c and 5d show the formation of a SOI substrate by a wafer bonding method.
Figure 5B:
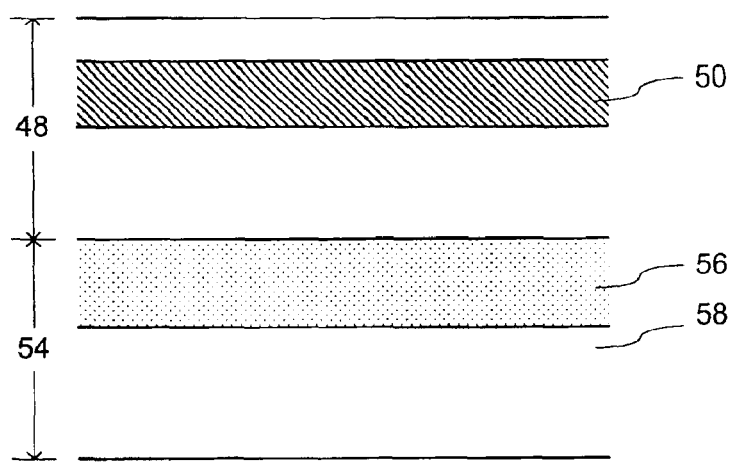
Figure 5C:
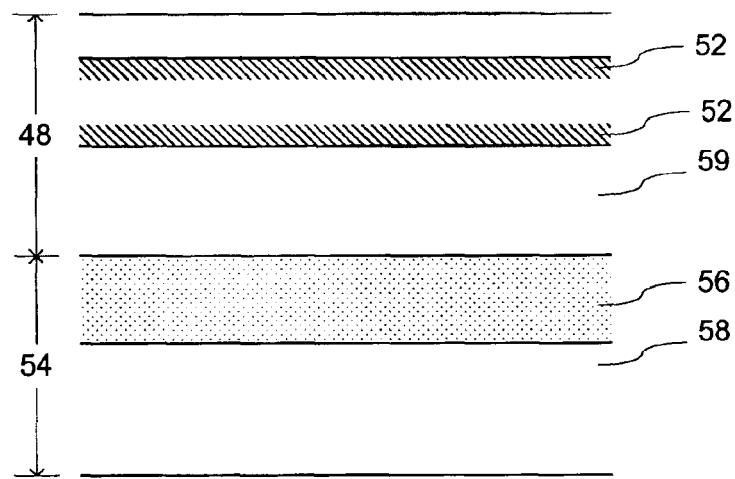
Figure 5D:
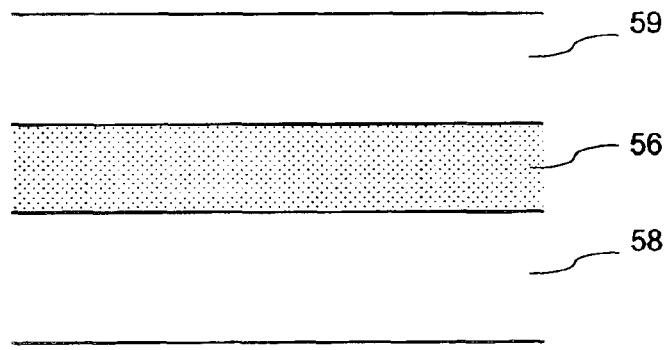

The resulting substrate is then planarized and cleaned, leaving a silicon germanium SOI substrate having a silicon germanium carbide thermal dissipation layer 108 overlying a dielectric layer 114 as shown in FIG. 5d.

While the aforementioned SOI substrate fabrication processes use a silicon germanium carbide thermal dissipation layer that is grown in situ in a single continuous process with a silicon germanium layer, the silicon germanium carbide layer may be formed in other manners. For example, the layer may be formed by growing a silicon germanium layer and then implanting carbon at an appropriate depth and in an appropriate dose, followed by annealing to form the desired silicon germanium carbide compound. In another alternative, a silicon germanium layer may be grown and carbon may then be diffused into the silicon germanium using a suitable precursor. An additional silicon germanium layer may then be grown over the silicon germanium carbide.

Figure 10:
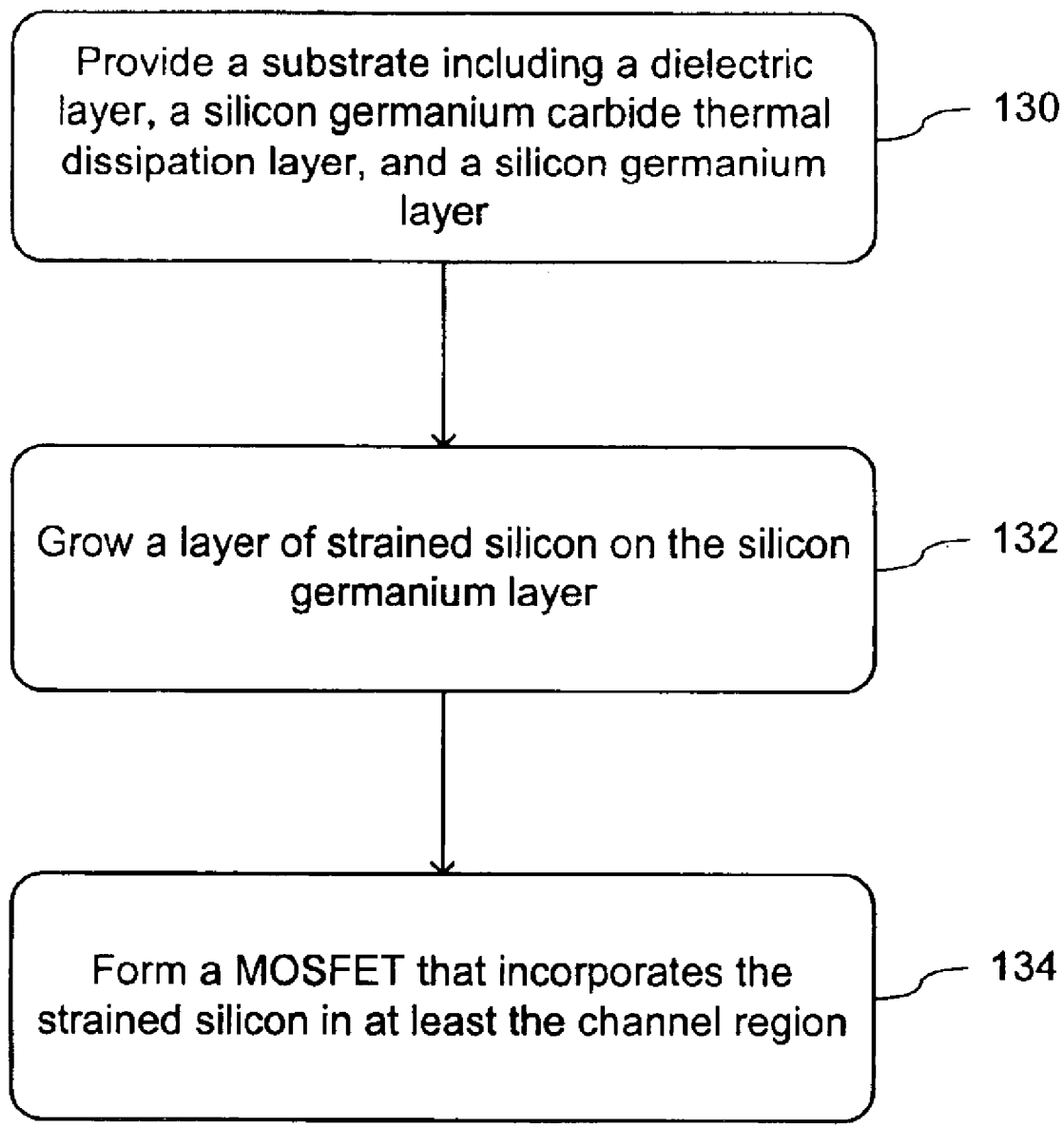
FIG. 10 shows a process flow encompassing the second preferred embodiment and alternative embodiments.

FIG. 10 shows a process flow for forming a semiconductor device encompassing the preferred embodiments of FIGS. 7a–7b and 8a–8d and alternative embodiments. Initially a substrate is provided (130). The substrate comprises a dielectric layer, a silicon germanium carbide thermal dissipation layer, and a silicon germanium layer. The substrate may be formed by a buried oxide method or a wafer bonding method. A layer of strained silicon is then grown on the silicon germanium layer (132), and a MOSFET that incorporates the strained silicon in at least its channel region is then formed on the substrate (134).

A variety of embodiments may therefore be implemented in accordance with the invention. In general terms, embodiments of the invention are implemented as strained silicon MOSFETs formed on a substrate comprising a layer of silicon germanium formed over a silicon germanium carbide thermal dissipation layer. The MOSFETs typically include strained silicon in at least their channel regions. The MOSFETs are typically formed in active regions of the substrate defined by shallow trench isolations. The substrate may be a semiconductor substrate in which the silicon germanium carbide thermal dissipation layer is formed on a silicon wafer, or the substrate may be an SOI substrate in which the silicon germanium carbide thermal dissipation layer is formed on a dielectric layer. The silicon germanium carbide thermal dissipation layer provides enhanced thermal dissipation in both semiconductor substrate and SOI devices.

It may be desirable to implement other features in order to further improve device performance. For example, source and drain suicides may be formed using a metal that produces a silicide having an inherent compressive strain. The resulting compression in the source and drain silicides applies tensile strain to the channel region, thus further enhancing channel region carrier mobility. Topside passivation materials may also be chosen to induce further strain in the strained silicon. It may also be desirable to remove the silicon germanium material beneath the strained silicon of the channel region to leave an open cavity, thus effectively creating a fully depleted strained silicon on insulator channel region.

The tasks described in the above processes are not necessarily exclusive of other tasks, and further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the processes described herein need not be performed on an entire substrate such as an entire wafer, but may instead be performed selectively on sections of the substrate. Also, while tasks performed during the fabrication of structure described herein are shown as occurring in a particular order for purposes of example, in some instances the tasks may be performed in alternative orders while still achieving the purpose of the process. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for the formation of a semiconductor device, comprising:

provinding a substrate comprising a silicon layer, a silicon germanium carbide thermal dissipation layer formed on the silicon layer, and a silicon germanium layer formed on the silicon germanium carbide thermal dissipation layer;

growing a layer of strained silicon on the silicon germanium layer; and forming a MOSFET on the substrate that incorporates the strained silicon in at least a channel region thereof.

2. The method claimed in claim 1, wherein growing the layer of strained silicon is preceded by forming shallow trench isolations in the silicon germanium layer to define an active region of the substrate in which the MOSFET is to be formed.

3. The method claimed in claim 2, wherein the shallow trench isolations comprise an oxide trench liner and a silicon carbide bulk fill material.

4. The method claimed in claim 3, wherein the shallow trench isolations extend through the silicon germanium layer to contact the silicon germanium carbide thermal dissipation layer.

5. The method claimed in claim 1, wherein providing the substrate comprises:

providing a silicon wafer;

growing the silicon germanium carbide thermal dissipation layer on the silicon wafer; and growing the silicon germanium layer on the silicon germanium carbide thermal dissipation layer.

6. A method for the formation of a semiconductor device, comprising:

providing a substrate comprising a dielectric layer, a silicon germanium carbide thermal dissipation layer formed on the dielectric layer, and a silicon germanium layer formed on the silicon germanium carbide thermal dissipation layer;

growing a layer of strained silicon on the silicon germanium layer; and forming a MOSFET on the substrate that incorporates the strained silicon in at least a channel region thereof.

7. The method claimed in claim 6, wherein growing the layer of strained silicon is preceded by forming shallow trench isolations in the silicon germanium layer to define an active region of the substrate in which the MOSFET is to be formed.

8. The method claimed in claim 7, wherein the shallow trench isolations comprise an oxide trench liner and a silicon carbide bulk fill material.

9. The method claimed in claim 8, wherein the shallow trench isolations extend through the silicon germanium layer to contact the silicon germanium carbide thermal dissipation layer.

10. The method claimed in claim 6, wherein providing the substrate comprises:

providing a first silicon wafer;

forming the silicon germanium layer on the first silicon wafer;

forming the silicon germanium carbide thermal dissipation layer on the silicon germanium layer;

implanting hydrogen into the silicon germanium layer to form a hydrogen rich region in the silicon germanium layer;

forming a dielectric layer on a second silicon wafer;

bonding the silicon germanium carbide thermal dissipation layer of the first silicon wafer to the dielectric layer of the second silicon wafer and concurrently fracturing the silicon germanium layer in the hydrogen rich region; and removing first silicon wafer.

11. The method claimed in claim 10 wherein forming the silicon germanium carbide thermal dissipation layer comprises implanting carbon into the silicon germanium layer.

12. The method claimed in claim 10, wherein forming the silicon germanium carbide thermal dissipation layer comprises diffusing carbon into the silicon germanium layer.

13. The method claimed in claim 10, wherein forming the silicon germanium carbide thermal dissipation layer comprises growing the silicon germanium carbide thermal dissipation layer on the silicon germanium layer by chemical vapor deposition using source gases that provide silicon, germanium and carbon precursors.

14. The method claimed in claim 13, wherein the source gases comprise organosilicates.

15. The method claimed in claim 6, wherein providing the substrate comprises:

providing a silicon wafer;

growing the silicon germanium carbide thermal dissipation layer on the silicon wafer;

growing the silicon germanium layer on the silicon germanium carbide thermal dissipation layer;

implanting oxygen into the silicon germanium carbide thermal dissipation layer; and annealing to form an oxide region in the silicon germanium carbide thermal dissipation layer.

\* \* \* \* \*